US012804960B2

(12) United States Patent
Yoo et al.

(10) Patent No.: US 12,804,960 B2
(45) Date of Patent: Nov. 17, 2026

(54) FIELD EFFECT TRANSISTOR, ELECTRONIC APPARATUS INCLUDING THE SAME, AND METHOD OF MANUFACTURING THE FIELD EFFECT TRANSISTOR

(71) Applicant: Samsung Electronics Co., Ltd., Suwon-si (KR)

(72) Inventors: Minseok Yoo, Suwon-si (KR); Minsu Seol, Seoul (KR); Junyoung Kwon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 776 days.

(21) Appl. No.: 17/699,463

(22) Filed: Mar. 21, 2022

(65) Prior Publication Data

US 2023/0103876 A1 Apr. 6, 2023

(30) Foreign Application Priority Data

Oct. 5, 2021 (KR) ........................ 10-2021-0131974

(51) Int. Cl.
*H10D 48/36* (2025.01)
*H10D 30/01* (2025.01)
(Continued)

(52) U.S. Cl.
CPC ........... *H10D 48/362* (2025.01); *H10D 30/01* (2025.01); *H10D 30/6713* (2025.01); (Continued)

(58) Field of Classification Search
CPC ........... H01L 29/41783; H01L 29/0847; H01L 29/42376
See application file for complete search history.

(56) References Cited

U.S. PATENT DOCUMENTS 7,968,674 B2 6/2011 Choi et al.
7,988,941 B2 8/2011 Choi et al.
(Continued)

FOREIGN PATENT DOCUMENTS

CN 102931057 A * 2/2013
CN 102931057 B 3/2015
(Continued)

OTHER PUBLICATIONS

Chris D. English et al., 'Improved Contacts to $MoS_2$ Transistors by Ultra-High Vacuum Metal Deposition' *Nano Letters*, vol. 16, 2016.
(Continued)

*Primary Examiner* — Dale E Page
(74) *Attorney, Agent, or Firm* — Harness, Dickey & Pierce, P.L.C.

(57) ABSTRACT

Provided are a field effect transistor, an electronic apparatus including the same, and a method of manufacturing the field effect transistor. The field effect transistor may include a substrate; a gate electrode on the substrate; an insulating layer on the gate electrode; a source electrode on the insulating layer; a drain electrode apart from the source electrode; a channel between the source electrode and the drain electrode and including a two-dimensional (2D) material; a 2D material electrode bonding layer adjacent to the source electrode and the drain electrode; and a stressor adjacent to the 2D material electrode bonding layer. The stressor may be configured to apply a tensile strain to the 2D material electrode bonding layer.

30 Claims, 24 Drawing Sheets

(51) Int. Cl.

| | |
|---|---|
| ***H10D 30/67*** | (2025.01) |
| ***H10D 62/80*** | (2025.01) |
| ***H10D 62/83*** | (2025.01) |
| ***H10D 99/00*** | (2025.01) |
| ***H10P 14/20*** | (2026.01) |

(52) U.S. Cl.

CPC ......... *H10D 30/6757* (2025.01); *H10D 62/80* (2025.01); *H10D 62/8303* (2025.01); *H10D 62/882* (2025.01); *H10D 99/00* (2025.01); *H10P 14/3402* (2026.01); *H10P 14/3406* (2026.01); *H10P 14/3436* (2026.01)

(56) References Cited

U.S. PATENT DOCUMENTS

| | | | | |
|---|---|---|---|---|
| 8,133,466 | B2 | 3/2012 | Shin et al. | |
| 8,283,038 | B2 | 10/2012 | Choi et al. | |
| 8,535,553 | B2 | 9/2013 | Kong et al. | |
| 8,623,761 | B2 | 1/2014 | Bonilla et al. | |
| 8,723,024 | B2 | 5/2014 | Choi et al. | |
| 8,895,433 | B2 | 11/2014 | Bonilla et al. | |
| 8,906,787 | B2 | 12/2014 | Park et al. | |
| 8,912,530 | B2 | 12/2014 | Yang et al. | |
| 9,040,957 | B2 | 5/2015 | Lee et al. | |
| 9,056,424 | B2 | 6/2015 | Wenxu et al. | |
| 9,064,777 | B2 | 6/2015 | Heo et al. | |
| 9,076,686 | B1 | 7/2015 | Karda et al. | |
| 9,108,848 | B2 | 8/2015 | Woo et al. | |
| 9,324,634 | B2 | 4/2016 | Bao et al. | |
| 9,324,635 | B2 | 4/2016 | Bao et al. | |
| 9,359,211 | B2 | 6/2016 | Woo et al. | |
| 9,472,450 | B2 | 10/2016 | Bonilla et al. | |
| 9,527,043 | B2 | 12/2016 | Choi et al. | |
| 9,533,265 | B2 | 1/2017 | Choi et al. | |
| 9,583,358 | B2 | 2/2017 | Kim et al. | |
| 9,595,580 | B2 | 3/2017 | Shin et al. | |
| 9,721,734 | B2 | 8/2017 | Ryu et al. | |
| 10,056,498 | B2 | 8/2018 | Yeh et al. | |
| 10,263,107 | B2 | 4/2019 | Ozkan et al. | |
| 10,325,987 | B2 | 6/2019 | Park et al. | |
| 10,672,894 | B2 | 6/2020 | Van Houdt et al. | |
| 10,741,646 | B2 | 8/2020 | Yeh et al. | |
| 2011/0127471 | A1 | 6/2011 | Shin et al. | |
| 2013/0059155 | A1 | 3/2013 | Choi et al. | |
| 2014/0087191 | A1 | 3/2014 | Chua et al. | |
| 2015/0235959 | A1 | 8/2015 | Lee et al. | |
| 2018/0012962 | A1* | 1/2018 | Yeh ...................... | H10D 62/151 |
| 2018/0315852 | A1* | 11/2018 | Ozkan .................. | H10D 30/792 |

FOREIGN PATENT DOCUMENTS

| | | | | |
|---|---|---|---|---|
| KR | 2019/0076843 | A | 7/2019 | |
| KR | 102045064 | B1 | 11/2019 | |
| WO | WO-2018/009931 | A1 | 1/2018 | |
| WO | WO-2021090106 | A1 * | 5/2021 | ......... H10D 30/6729 |

OTHER PUBLICATIONS

Minhoon Park et al., ‘$MoS_2$ -Based Tactile Sensor for Electronic Skin Applications’ *Advanced Materials*, vol. 28, 2016, pp. 2556-2562.

Sheng Yu et al., ‘Phase transition, effective mass and carrier mobility of $MoS_2$ monolayer under tensile strain’ *Applied Surface Science*, vol. 325, 2015, pp. 27-32.

Gerd Plechinger et al., ‘Control of biaxial strain in single-layer molybdenite using local thermal expansion of the substrate’ *2D Materials*, vol. 2, 2015, p. 015006.

Hong Li et al., ‘Optoelectronic crystal of artificial atoms in strain-textured molybdenum disulphide’ *Nature Communications*, vol. 6:7381, Jun. 2015.

Hiram J. Conley et al., ‘Bandgap Engineering of Strained Monolayer and Bilayer $MoS_2$’ *Nano Letters*, vol. 13, Jul. 2013, pp. 3626-3630.

Extended European Search Report dated Nov. 15, 2022, issued in corresponding European Patent Application No. 22173723.2.

Korean Office Action dated Oct. 17, 2025 for corresponding Korean Patent Application No. 10-2021-0131974 and its English-language translation.

Anuja Chanana et al., Prospects of zero Schottky barrier height in a graphene-inserted MoS2-metal interface. J. Appl. Phys. Jan. 7, 2016; 119 (1): 014303. https://doi.org/10.1063/1.4938742.

Ashby Phillip John et al, Strain-engineering the Schottky barrier and electrical transport on MoS2, Nanotechnology 31 (2020) 275703. DOI: 10.1088/1361-6528/ab83b7.

* cited by examiner

FIELD EFFECT TRANSISTOR, ELECTRONIC APPARATUS INCLUDING THE SAME, AND METHOD OF MANUFACTURING THE FIELD EFFECT TRANSISTOR

CROSS-REFERENCE TO RELATED APPLICATIONS

This application is based on and claims priority under 35 U.S.C. § 119 to Korean Patent Application No. 10-2021-0131974, filed on Oct. 5, 2021, in the Korean Intellectual Property Office, the disclosure of which is incorporated by reference herein in its entirety.

BACKGROUND

1. Field

The present disclosure relates to a field effect transistor wherein a tensile strain is applied to a two-dimensional (2D) material electrode bonding layer to increase the conductivity thereof, an electronic apparatus including the field effect transistor, and/or a method of manufacturing the field effect transistor.

2. Description of the Related Art

Transistors, which are semiconductor devices for performing an electrical switching function, have been used for various integrated circuit (IC) devices including memories, driving ICs, logic devices, etc. In order to increase the degree of integration of an IC device, a space occupied by a transistor provided therein has been rapidly reduced, and thus, research has been conducted to reduce the size of the transistor while maintaining the performance thereof.

One of the important parts of the transistor is a gate electrode. When a voltage is applied to the gate electrode, a channel adjacent to a gate opens a path for a current and, in an opposite case, blocks a current. The performance of a semiconductor depends on how much a leakage current is reduced and efficiently managed in the gate electrode and the channel. The greater the corresponding area between the channel and the gate electrode that controls a current in the transistor, the higher the power efficiency.

As semiconductor processes become more refined, the size of the transistor is reduced, and thus, the corresponding area between the gate electrode and the channel is also reduced, which may cause problems due to a short channel effect. For example, phenomena such as threshold voltage variation, carrier velocity saturation, and deterioration of subthreshold characteristics may occur.

SUMMARY

Provided is a field effect transistor where the conductivity of a two-dimensional (2D) material electrode bonding layer is increased.

Provided is an electronic apparatus including a field effect transistor where the conductivity of a 2D material electrode bonding layer is increased.

Provided is a method of manufacturing a field effect transistor where a tensile strain is applied to a 2D material electrode bonding layer.

Additional aspects will be set forth in part in the description which follows and, in part, will be apparent from the description, or may be learned by practice of the presented embodiments of the disclosure.

According to an embodiment, a field effect transistor may include a substrate; a gate electrode on the substrate; an insulating layer on the gate electrode; a source electrode on the insulating layer; a drain electrode apart from the source electrode; a channel between the source electrode and the drain electrode and including a 2D material; a 2D material electrode bonding layer adjacent to the source electrode and the drain electrode and including a tensile strain region; and a stressor adjacent to the 2D material electrode bonding layer and configured to apply a tensile strain to the 2D material electrode bonding layer.

In some embodiments, the 2D material electrode bonding layer may include graphene, black phosphorus, phosphorene, or transition metal dichalcogenide.

In some embodiments, the transition metal dichalcogenide may include a transition metal and a chalcogen element. The transition metal may include one of Mo, W, Nb, V, Ta, Ti, Zr, Hf, Tc, Re, Cu, Ga, In, Sn, Ge, and Pb. The chalcogen element may include one of S, Se, and Te.

In some embodiments, the transition metal dichalcogenide may include one of $MoS_2$, $WS_2$, $MoSe_2$, and $WSe_2$.

In some embodiments, the channel may be configured to have no tensile strain region.

In some embodiments, the 2D material electrode bonding layer may be integrally provided with the channel.

In some embodiments, the stressor may be positioned above the 2D material electrode bonding layer, below the 2D material electrode bonding layer, or below the source electrode and the drain electrode.

In some embodiments, the stressor may include a material represented by $(M1)_a(M2)_b$, wherein M1 may include any one of Mo, W, Hf, Nb, and Si, M2 may include any one of O, S, Se, Te, and N, and $0<a\leq3$ and $0<b\leq3$.

In some embodiments, the stressor may include MoO, $MoO_2$, $MoO_3$, $PtS_2$, $SiO_2$, or SiN.

In some embodiments, the 2D material electrode bonding layer may include a strain region in a region facing the stressor.

In some embodiments, the field effect transistor may further include an interlayer including TiOx ($0<x\leq3$) or CrOx ($0<x\leq3$) between the 2D material electrode bonding layer and the stressor.

In some embodiments, the stressor may be configured to operate as an electrode.

In some embodiments, the tensile strain region may be in the 2D material electrode bonding layer.

According to an embodiment, an electronic apparatus may include: a memory including a field effect transistor; and a memory controller configured to control the memory. The field effect transistor may include a substrate; a gate electrode on the substrate; an insulating layer on the gate electrode; a source electrode on the insulating layer; a drain electrode spaced apart from the source electrode; a channel between the source electrode and the drain electrode and including a 2D material; a 2D material electrode bonding layer adjacent to the source electrode and the drain electrode and including a tensile strain region; and a stressor adjacent to the 2D material electrode bonding layer and configured to apply a tensile strain to the 2D material electrode bonding layer.

According to an embodiment, a method of manufacturing a field effect transistor may include: forming a gate electrode on a substrate; forming an insulating layer on the gate electrode; forming a source electrode and a drain electrode on the insulating layer; forming a channel between the source electrode and the drain electrode, the channel including a 2D material; forming a 2D material electrode bonding layer adjacent to the source electrode and the drain electrode; forming a stressor adjacent to the 2D material electrode bonding layer; and applying a tensile strain to the 2D material electrode bonding layer by oxidizing the stressor.

According to an embodiment, a field effect transistor may include a substrate; a plurality of electrodes including a source electrode, a drain electrode, and a gate electrode spaced apart from each other on the substrate; a channel on the substrate between the source electrode and the drain electrode, the channel including a two-dimensional (2D) material; an insulating layer extending between the channel and the gate electrode; a first 2D material electrode bonding layer connected to a first end of the channel; and a first stressor on at least one of the insulating layer and the source electrode. The first 2D material electrode bonding layer may be spaced apart from the gate electrode and the drain electrode. The first stressor may be adjacent to the first 2D material electrode bonding layer and may be configured to apply a tensile strain to the first 2D material electrode bonding layer.

In some embodiments, the first 2D material electrode bonding layer may include graphene, black phosphorus, phosphorene, or transition metal dichalcogenide.

In some embodiments, the first stressor may include a material represented by $(M1)_a(M2)_b$, where M1 includes any one of Mo, W, Hf, Nb, and Si, M2 includes any one of O, S, Se, Te, and N, $0<a\leq3$, and $0<b\leq3$.

In some embodiments, the first 2D material electrode bonding layer may be integrally provided with the channel.

In some embodiments, the field effect transistor may further include a second 2D material electrode bonding layer connected to a second end of the channel; and a second stressor on at least one of the insulating layer and the drain electrode. The second 2D material electrode bonding layer may be spaced apart from the gate electrode and the source electrode. The second stressor may be adjacent to the second 2D material electrode bonding layer and may be configured to apply a tensile strain to the second 2D material electrode bonding layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
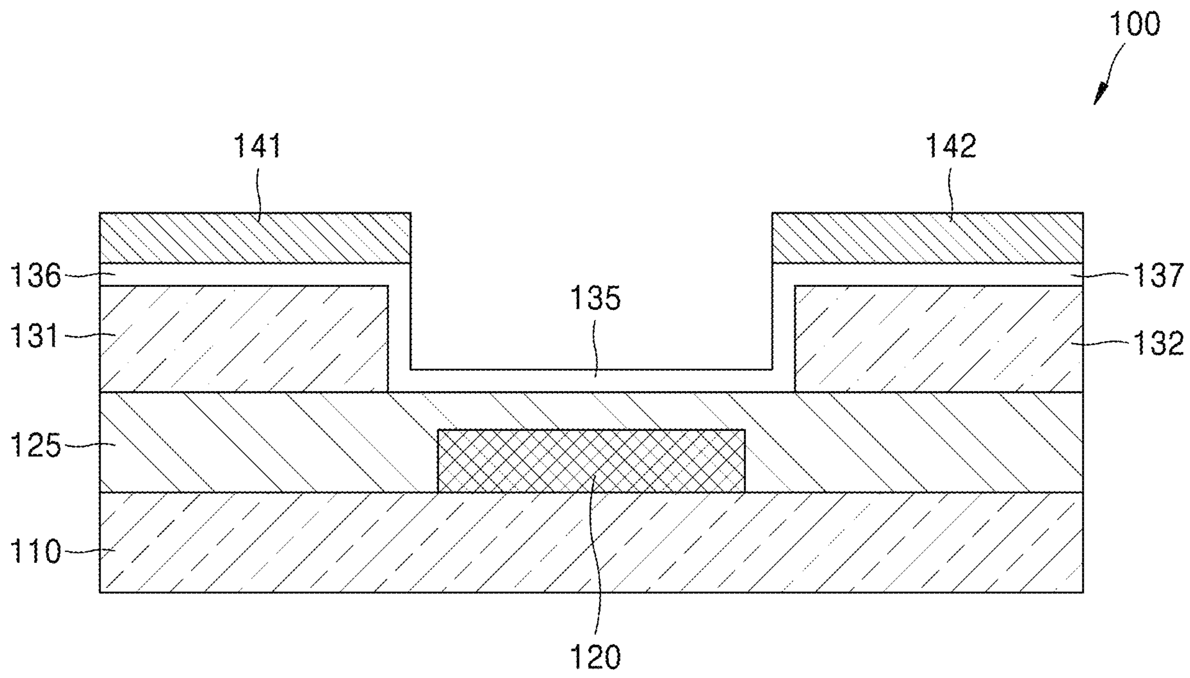
FIG. 1 illustrates a structure of a stressor of a field effect transistor before a chemical reaction, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term “and/or” includes any and all combinations of one or more of the associated listed items. Expressions such as “at least one of,” when preceding a list of elements, modify the entire list of elements and do not modify the individual elements of the list. For example, “at least one of A, B, and C,” and similar language (e.g., “at least one selected from the group consisting of A, B, and C”) may be construed as A only, B only, C only, or any combination of two or more of A, B, and C, such as, for instance, ABC, AB, BC, and AC.

Hereinafter, a field effect transistor, an electronic apparatus including the same, and a method of manufacturing the field effect transistor according to various embodiments will be described in detail with reference to the accompanying drawings. In the following drawings, like reference numerals denote like elements, and the size of each element may be exaggerated for clarity and convenience of description. It will be understood that, although the terms “first”, “second”, etc. may be used herein to describe various elements, these elements should not be limited by these terms. These terms are only used to distinguish one element from another.

An expression used in the singular form also encompasses the plural expression unless it has a clearly different meaning in the context. It will be further understood that when a part "includes" or "comprises" an element, the part may further include other elements, not excluding the other elements, unless defined otherwise. Also, in the drawings, the size or thickness of each element may be exaggerated for clarity of description. It will be further understood that when a material layer is referred to as being "on" another substrate or layer, the material layer may be directly on the other substrate or layer, or a third layers may be present therebetween. Also, materials constituting each layer in the following embodiments are exemplary, and other materials than the described ones may also be used.

Also, the terms " . . . unit," "module," etc. used in the specification indicate a unit that processes at least one function or motion, and the unit may be implemented by hardware or software, or by a combination of hardware and software.

The particular implementations shown and described herein are examples of the present disclosure and are not intended to otherwise limit the scope of the present disclosure in any way. For brevity of the specification, descriptions of conventional electronic configurations, control systems, software, and other functional aspects of the systems may be omitted. Also, line connections or connection members between elements depicted in the drawings represent functional connections and/or physical or circuit connections by way of example, and in an actual device, they may be replaced or embodied with various suitable additional functional connections, physical connections, or circuit connections.

The use of term "the" and other similar determiners may correspond to both a singular form and a plural form.

Unless orders of operations included in a method are specifically described, the operations may be performed according to appropriate orders. Also, the use of all example terms (e.g., "such as" and "etc.") is intended merely to describe the disclosure in detail and does not pose a limitation on the scope of the disclosure unless otherwise claimed.

FIG. 1 is a cross-sectional view of a field effect transistor according to an example embodiment.

A field effect transistor 100 includes a substrate 110, a gate electrode 120 provided on the substrate 110, an insulating layer 125 provided on the gate electrode 120, a source electrode 131 provided on the insulating layer 125, a drain electrode 132 provided apart from the source electrode 131, and a channel 135 provided between the source electrode 131 and the drain electrode 132.

The substrate 110 may be an insulating substrate, or may be a semiconductor substrate having an insulating layer formed on a surface thereof. The semiconductor substrate may include, for example, Si, Ge, SiGe, or a Group III-V semiconductor material. The substrate 110 may be, for example, a silicon substrate having silicon oxide formed on a surface thereof, but is not limited thereto.

The channel 135 may include a two-dimensional (2D) material. The 2D material may include graphene, black phosphorus, phosphorene, or transition metal dichalcogenide. The transition metal dichalcogenide may include one transition metal selected from the group consisting of Mo, W, Nb, V, Ta, Ti, Zr, Hf, Tc, Re, Cu, Ga, In, Sn, Ge, and Pb and chalcogen elements selected from the group consisting of S, Se, and Te. The transition metal dichalcogenide may include, for example, one of $MoS_2$, $WS_2$, $MoSe_2$, and $WSe_2$.

A first 2D material electrode bonding layer 136 may be provided adjacent to the source electrode 131, and a second 2D material electrode bonding layer 137 may be provided adjacent to the drain electrode 132. The first 2D material electrode bonding layer 136 may be arranged to face the source electrode 131, and may be arranged in direct contact with the source electrode 131. The second 2D material electrode bonding layer 137 may be arranged to face the drain electrode 132, and may be arranged in direct contact with the source electrode 132. The first 2D material electrode bonding layer 136 and the second 2D material electrode bonding layer 137 include a 2D material, wherein the 2D material is the same as described above. The first 2D material electrode bonding layer 136 and the second 2D material electrode bonding layer 137 may extend from the channel 135. A first stressor 141 may be provided on the first 2D material electrode bonding layer 136, and a second stressor 142 may be provided on the second 2D material electrode bonding layer 137. Positions of the first stressor 141 and the second stressor 142 are not limited thereto, and the first and second stressors 141 and 142 may be respectively positioned above or below the first and second 2D material electrode bonding layers 136 and 137, or below the source and drain electrodes 131 and 132. The first and second stressors 141 and 142 may include, for example, a material represented by $(M1)_a(M2)_b$, wherein M1 may include any one of Mo, W, Hf, Nb, and Si, M2 may include any one of O, S, Se, Te, and N, and $0<a\leq3$ and $0<b\leq3$. The first and second stressors 141 and 142 may include chemical reactants of M1 and M2. FIG. 1 illustrates a state in which the first 2D material electrode bonding layer 136 and the second 2D material electrode bonding layer 137 are in a strain-free state.

Figure 2:
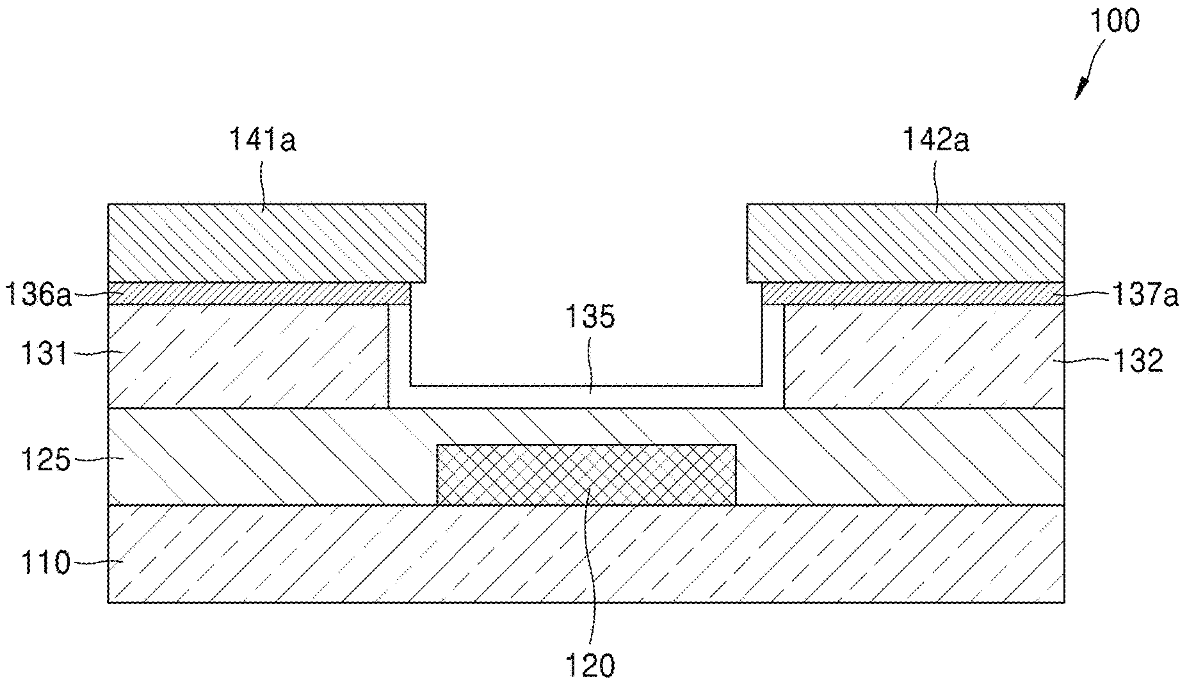
FIG. 2 illustrates a structure of a stressor of a field effect transistor after a chemical reaction, according to an example embodiment.

Referring to FIG. 2, a chemical reaction may occur in each of first and second stressors 141*a* and 142*a*, and volumes of the first and second stressors 141*a* and 142*a* may increase according to the chemical reactions of the first and second stressors 141*a* and 142*a*. When the volumes of the first and second stressors 141*a* and 142*a* increase, a first 2D material-electrode bonding layer 136*a* and a second 2D material electrode bonding layer 137*a* may be stretched, and thus, the first 2D material electrode bonding layer 136*a* and the second 2D material-electrode bonding layer 137*a* may include a tensile strain region.

Because the first and second stressors 141*a* and 142*a* are provided on the first 2D material electrode bonding layer 136*a* and the second 2D material electrode bonding layer 137*a*, and not on the channel 135, the channel 135 may be configured to have no strain region. When a strain is applied to the channel 135, because the channel 135 has a large energy bandgap, off-current may increase. Accordingly, no strain is applied to the channel 135.

Figure 3:
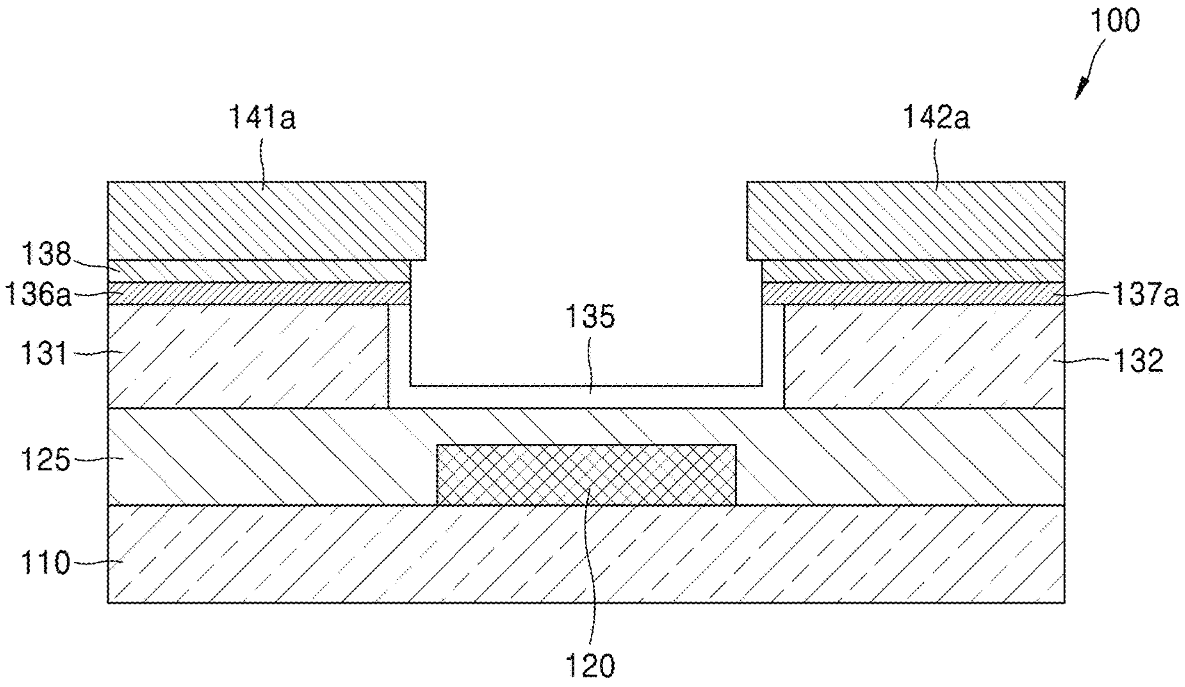
FIG. 3 illustrates an example in which an interlayer is further provided in the field effect transistor of FIG. 2.

Meanwhile, as illustrated in FIG. 3, an interlayer 138 may be further provided between the first material electrode bonding layer 136*a* and the first stressor 141*a* and between the second material electrode bonding layer 137*a* and the second stressor 142*a*. The interlayer 138 may include TiOx ($0<x\leq3$) or CrOx ($0<x\leq3$). The interlayer 138 may increase a bonding force between the first and second 2D material electrode bonding layers 136*a* and 137*a* and the first and second stressors 141*a* and 142*a*.

Figure 4:
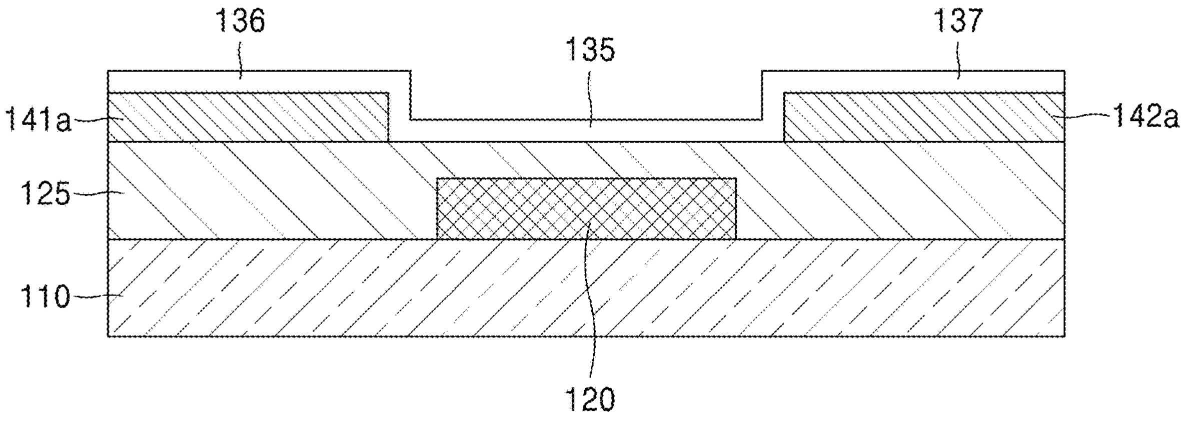
FIGS. 4, 5, and 6 illustrate a field effect transistor according to another example embodiment.
Figure 5:
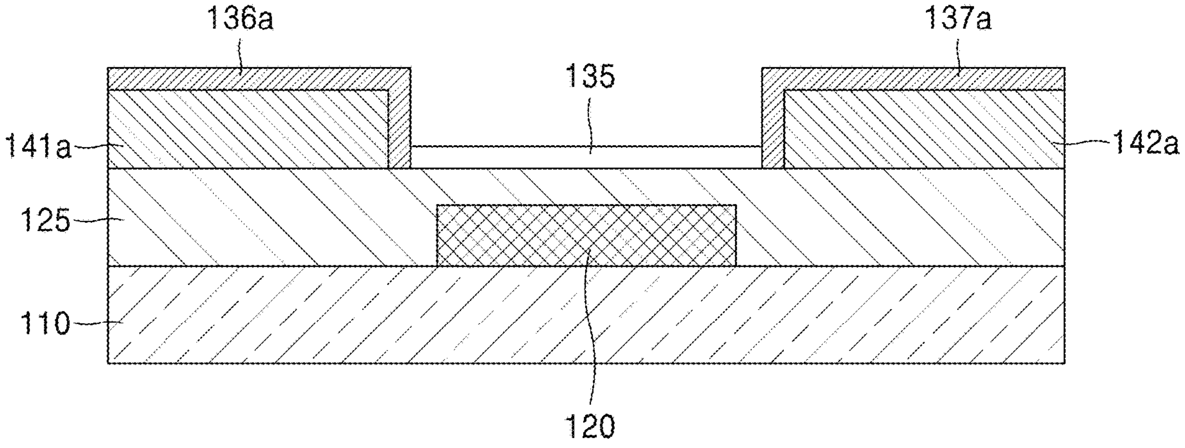
Figure 6:
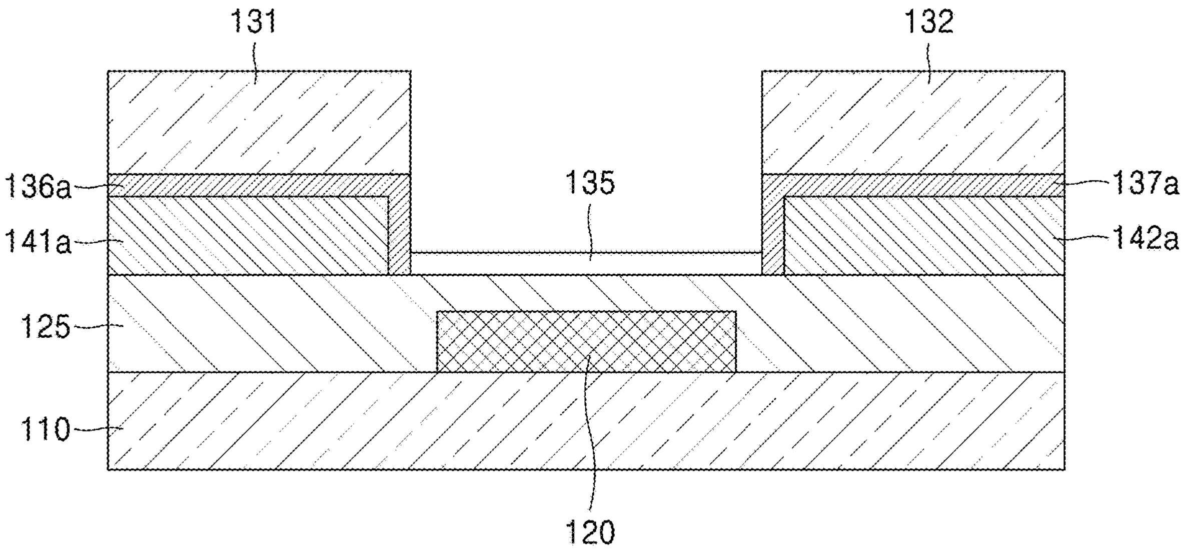

FIGS. 4, 5, and 6 illustrate an example in which a position of a stressor is changed. In FIG. 4, elements using the same reference numerals as those in FIG. 1 perform substantially the same functions and operations, and thus, detailed descriptions thereof are omitted. The first stressor 141*a* and the second stressor 142*a* may be provided on the insulating layer 125, the second stressor being arranged apart from the first stressor 141*a*. Referring to FIG. 5, the channel 135 may be provided in a region facing the gate electrode 120, the first 2D material electrode bonding layer 136*a* may be provided on the first stressor 141*a*, and the second 2D material electrode bonding layer 137*a* may be provided on the second stressor 142*a*. When the first stressor 141*a* and the second stressor 142*a* are chemically reacted, for example, oxidized, the first 2D material electrode bonding layer 136*a* and the second 2D material electrode bonding layer 137*a* may include a tensile strain region. The channel 135 has no strain region. Referring to FIG. 6, the source electrode 131 may be provided on the first 2D material electrode bonding layer 136*a*, and the drain electrode 132 may be provided on the second 2D material electrode bonding layer 137*a*. The first stressor 141*a* and the second stressor 142*a* may be provided adjacent to the first 2D material electrode bonding layer 136*a* and the second 2D material electrode bonding layer 137*a*, respectively, and may be arranged not to contact the channel 135.

Figure 7:
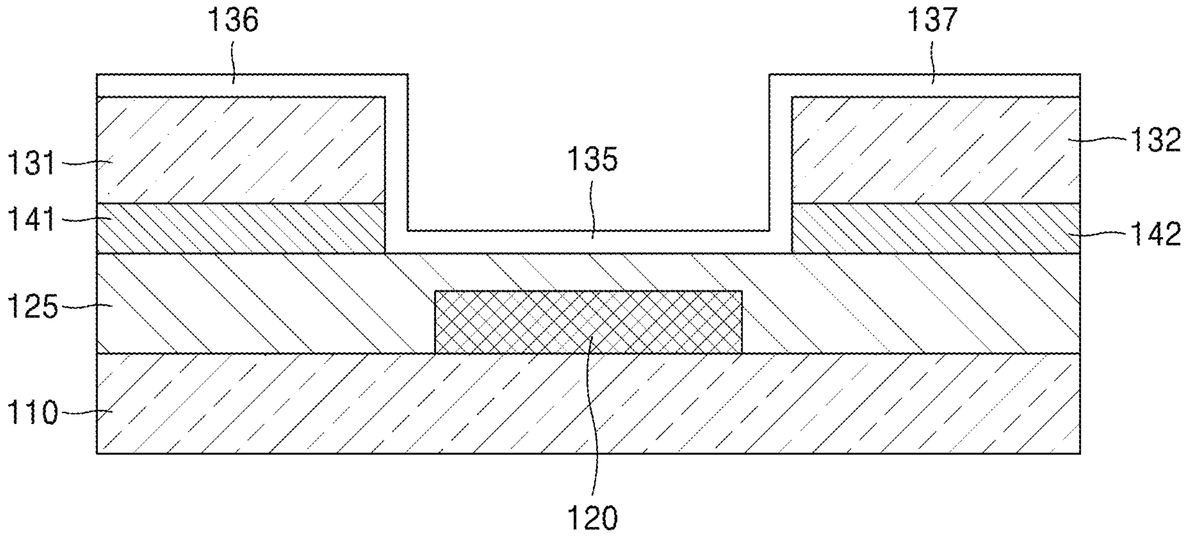
FIGS. 7 and 8 illustrate a field effect transistor according to another example embodiment.

In FIG. 7, as compared with FIG. 6, positions of the source electrode 131 and the first 2D material electrode bonding layer 136 are switched, and positions of the drain electrode 132 and the second 2D material electrode bonding layer 137 are switched. The first stressor 141 and the second stressor 142 may arranged apart from each other on the insulating layer 125, and the channel 135 may be provided between the first stressor 141 and the second stressor 142. The source electrode 131 may be provided on the first stressor 141, and the drain electrode 132 may be provided on the second stressor 142. The first 2D material electrode bonding layer 136 may be provided on the source electrode 131, and the second 2D material electrode bonding layer 137 may be provided on the drain electrode 132.

Figure 8:
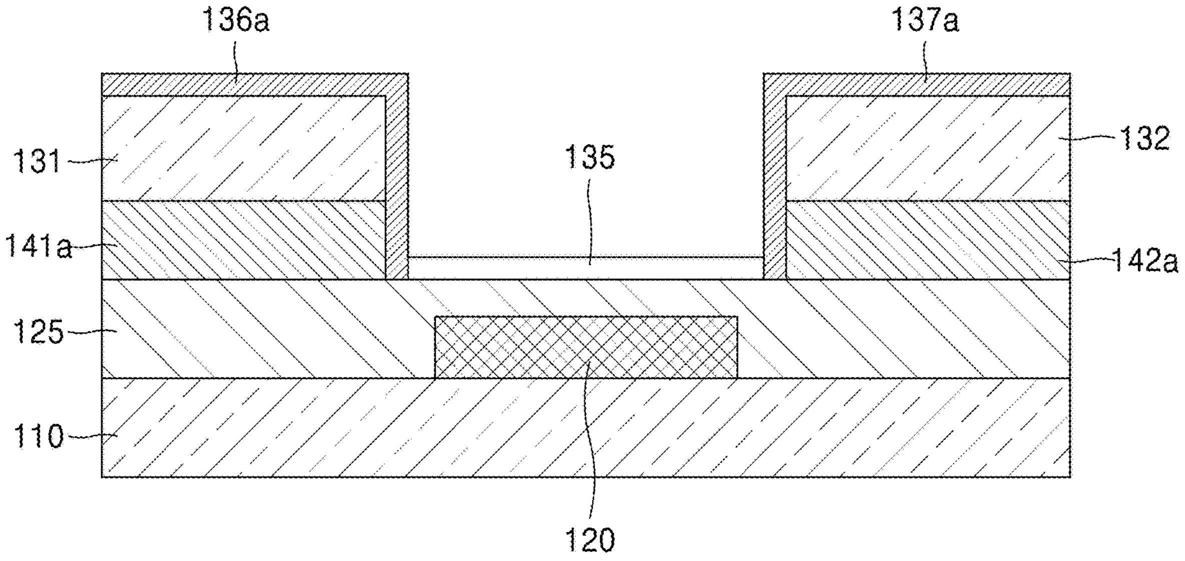

Referring to FIG. 8, the first stressor 141*a* and the second stressor 142*a* may be oxidized, and according to volume changes of the first stressor 141*a* and the second stressor 142*a*, the first 2D material electrode bonding layer 136*a* and the second 2D material electrode bonding layer 137*a* may include a tensile strain region.

Figure 9:
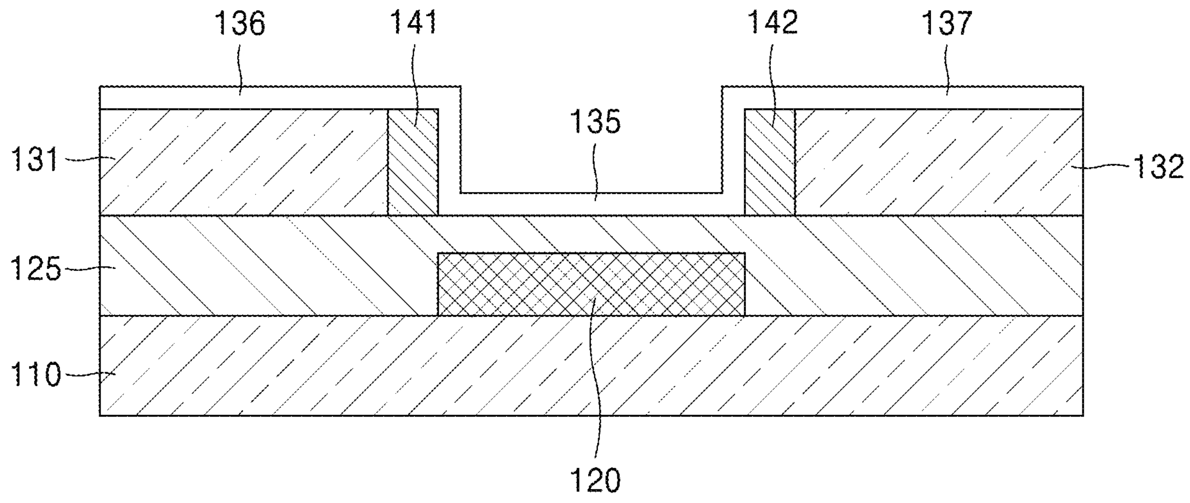
FIGS. 9 and 10 illustrate a field effect transistor according to another example embodiment.
Figure 10:
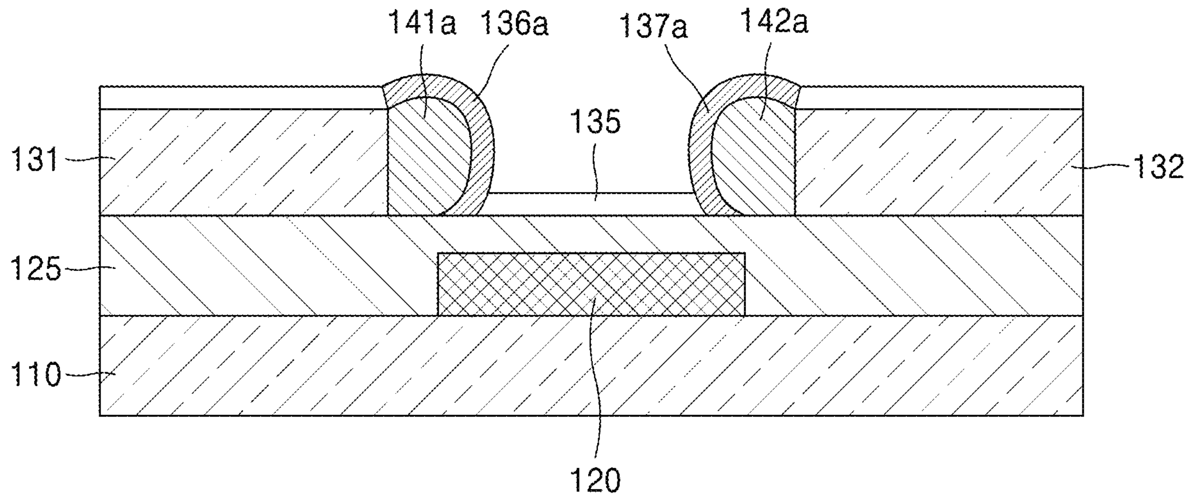

Referring to FIG. 9, the first stressor 141 may be provided between a side portion of the source electrode 131 and the first 2D material electrode bonding layer 136, and the second stressor 142 may be provided between a side portion of the drain electrode 132 and the second 2D material electrode bonding layer 137. Referring to FIG. 10, the first stressor 141*a* and the second stressor 142*a* may be oxidized so that the volumes thereof may increase, and according to the volume changes of the first stressor 141*a* and the second stressor 142*a*, the first 2D material electrode bonding layer 136*a* and the second 2D material electrode bonding layer 137*a* may include a tensile strain region. In this case, the first 2D material electrode bonding layer 136*a* on an upper portion of the source electrode 131 and the second 2D material electrode bonding layer 137*a* on an upper portion of the drain electrode 131 may not include a strain region.

Figure 11:
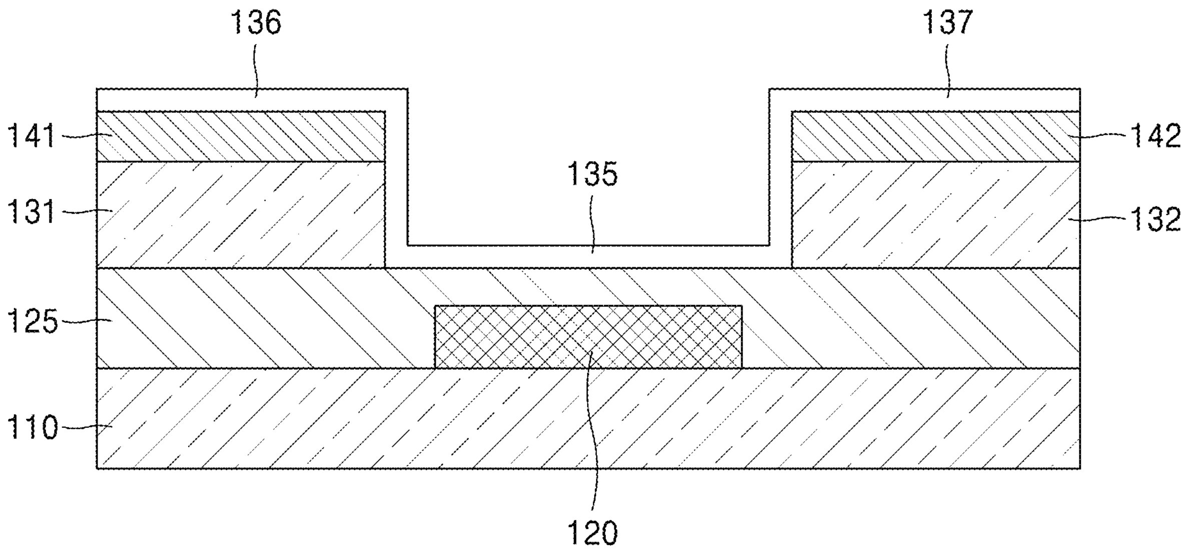
FIGS. 11 and 12 illustrate a field effect transistor according to another example embodiment.
Figure 12:
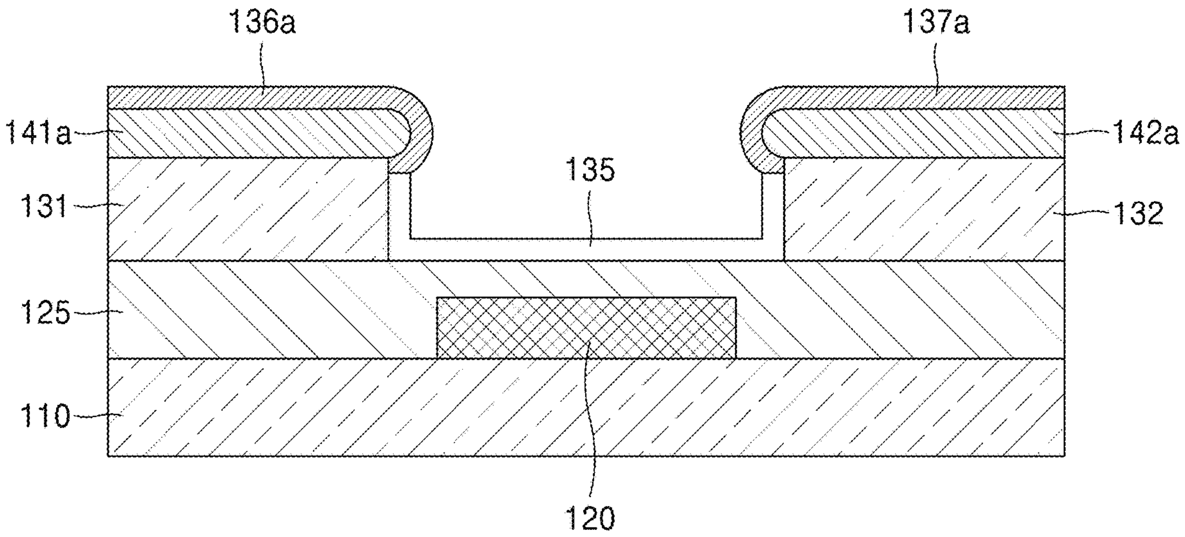

Referring to FIG. 11, the first stressor 141 may be provided between the upper portion of the source electrode 131 and the first 2D material electrode bonding layer 136, and the second stressor 142 may be provided between the upper portion of the drain electrode 132 and the second 2D material electrode bonding layer 137. Referring to FIG. 12, the first stressor 141*a* and the second stressor 142*a* may be oxidized so that the volumes thereof may increase, and according to the volume changes of the first stressor 141*a* and the second stressor 142*a*, the first 2D material electrode bonding layer 136*a* and the second 2D material electrode bonding layer 137*a* may include a tensile strain region. In the first 2D material electrode bonding layer 136*a* and the second 2D material electrode bonding layer 137*b*, a strain region may be locally provided in a region in contact with the first stressor 141*a* and the second stressor 142*a*.

Figure 13:
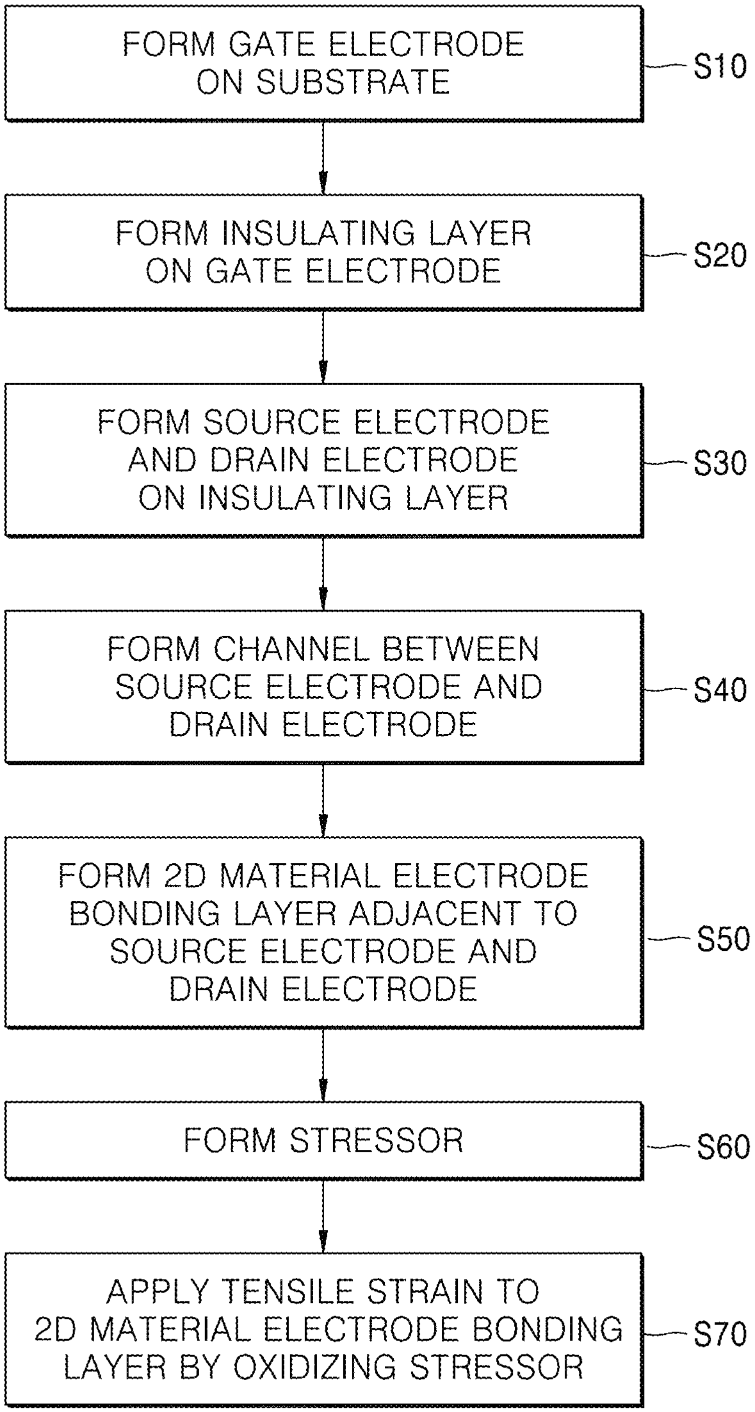
FIG. 13 is a diagram of a method of manufacturing a field effect transistor according to an example embodiment.

FIG. 13 is a diagram of a method of manufacturing a field effect transistor according to an example embodiment. The method of manufacturing a field effect transistor will be described with reference to FIGS. 1 and 2.

The method of manufacturing a field effect transistor according to an example embodiment includes forming the gate electrode 125 on the substrate 110 (S10), forming the insulating layer 125 on the gate electrode 125 (S20), and forming the source electrode 131 and the drain electrode 132 on the insulating layer 125 (S30). Also, the channel 135 may be formed between the source electrode 131 and the drain electrode 132 (S40). A 2D material electrode bonding layer may be formed adjacent to the source electrode 131 and the drain electrode 132 (S50). The first 2D material electrode bonding layer 136 may be formed adjacent to the source electrode 131, and the second 2D material electrode bonding layer 137 may be formed adjacent to the drain electrode 132. The first 2D material electrode bonding layer 136 may be provided in direct contact with the source electrode 131, and the second 2D material electrode bonding layer 137 may be provided in direct contact with the drain electrode 132. However, the present disclosure is not limited thereto, and the first 2D material electrode bonding layer 136 may be provided adjacent to the source electrode 131 without being in direct contact with the source electrode 131, and the second 2D material electrode bonding layer 137 may be provided adjacent to the drain electrode 132 without being in direct contact with the drain electrode 132.

The first 2D material electrode bonding layer 136 and the second 2D material electrode bonding layer 137 may extend from the channel 135 to be integrally formed.

Next, a stressor may be formed (S60). The stressor may include a chemically reactive material. The order of forming the stressor may vary depending on a position of the stressor. In FIG. 1, the first stressor 141 may be formed on an upper portion of the first 2D material electrode bonding layer 136, the second stressor 142 may be formed on an upper portion of the second 2D material electrode bonding layer 137.

A tensile strain may be applied to the 2D material electrode bonding layer by chemically reacting a stressor (S70). When the stressor is chemically reacted, for example, a $MoS_2$ stressor may be reacted at a temperature of about 330° C. in an oxygen or chalcogen atmosphere to induce volume expansion of the stressor. Referring to FIG. 2, the first stressor 141 may be oxidized, and the first stressor 141*a* that has been oxidized may have an increased volume. The second stressor 142 may be oxidized, and the second stressor 142*a* that has been oxidized may have an increased volume. A tensile strain region may be formed in a first 2D material electrode bonding layer 136*a* by the first stressor 141*a* that has been oxidized, and a tensile strain region may be formed in the second 2D material electrode bonding layer 137*a* by the second stressor 142*a* that has been oxidized.

Figure 14:
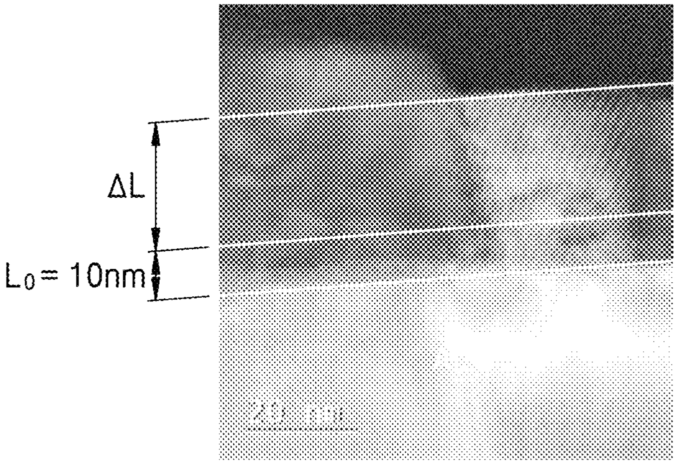
FIG. 14 illustrates a volume change according to an oxidation reaction of a stressor according to an example embodiment.

In the method of manufacturing a field effect transistor according to an example embodiment, a stressor may be formed adjacent to a 2D material electrode bonding layer, and a tensile strain may be applied locally to the 2D material electrode bonding layer by oxidizing the stressor. A region to which the tensile strain is applied in the 2D material electrode bonding layer may be selectively controlled according to a position of the stressor and an area of the stressor. FIG. 14 illustrates that when a Cr layer is deposited on an Au layer ($L_0$=10 nm), and the Cr layer is oxidized, a thickness of the oxidized $Cr_2O_3$ is increased by about 40 nm ($\Delta L$). The greater the chemical reaction of the stressor, the greater the volume change of the stressor, and the greater the size of the strain applied to the 2D material electrode bonding layer. For example, when a volume of the 2D material electrode bonding layer is doubled, strain ($\varepsilon$)=25.99%. More specifically, assuming that a thickness of the Cr layer is L before the reaction and expands isotropically after the reaction, in order for the volume of the Cr layer to be doubled after the reaction, the thickness of the Cr layer is changed to $2^{1/3}$ L. In this case, strain ($\varepsilon$)= ($\Delta L/LO$)*100=($2^{1/3}$ L−L)/L*100(%)=25.99%.

The size of the strain may be controlled by controlling the volume change of the stressor according to the degree of chemical reaction of the stressor. When a tensile strain is applied to the 2D material electrode bonding layer, an effective mass may decrease and carrier density may increase, thereby improving mobility. Accordingly, in the method of manufacturing a field effect transistor according to an example embodiment, a tensile strain is selectively applied to a 2D material electrode bonding layer such that the contact resistance of the 2D material electrode bonding layer may decrease, thereby increasing the conductivity thereof, while no strain is applied to a channel such that an increase in off current in the channel due to strain application may be prevented.

The field effect transistor according to an example embodiment may be applied to various 2D-based devices, and may contribute to improving characteristics of the 2D-based devices by improving the conductivity of a 2D material electrode bonding layer. The field effect transistor according to an example embodiment may be applied to, for example, a logic transistor, a memory selector transistor, a three-dimensional (3D) monolithic transistor, etc. When a strain is applied to a 2D material, the band structure, bandgap, conductivity, and effective mass thereof may increase or decrease according to the strain type, and thus, the conductivity of the material may be controlled.

When a tensile strain is applied to an n-type channel such as $MoS_2$, electron mobility may increase, mobility may be improved by about 9%, and an energy bandgap may decrease. Also, resistance may decrease when the tensile strain is applied. Accordingly, carrier injection may be improved by applying the tensile strain to the 2D material electrode bonding layer, as compared with an unstrained 2D-based field effect transistor.

Figure 15:
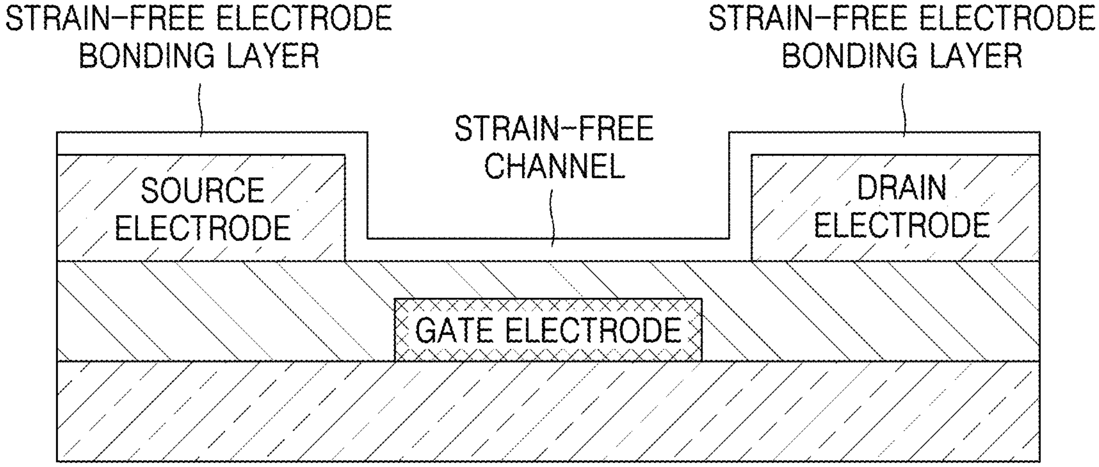
FIG. 15 illustrates a comparative example in which no strain is applied to a two-dimensional (2D) material electrode bonding layer.

FIG. 15 illustrates a comparative example. The comparative example is a 2D-based field effect transistor in which no strain is applied to both a channel and a 2D material electrode bonding layer. In the comparative example, an Au/In electrode structure maintains a non-oxidized state.

The size and type of a strain applied to a 2D material may be confirmed through Raman and photoluminescence (PL). When a tensile strain occurs, changes in a Raman peak down shift and peak splitting (in the case of $MoS_2$, an $E_{2g}^1$ peak is a measure) may appear, and a PL peak position and intensity may decrease. In the case of a compressive strain, opposite Raman and PL changes may appear. No strain occurs in the field effect transistor of the comparative example.

Figure 16A:
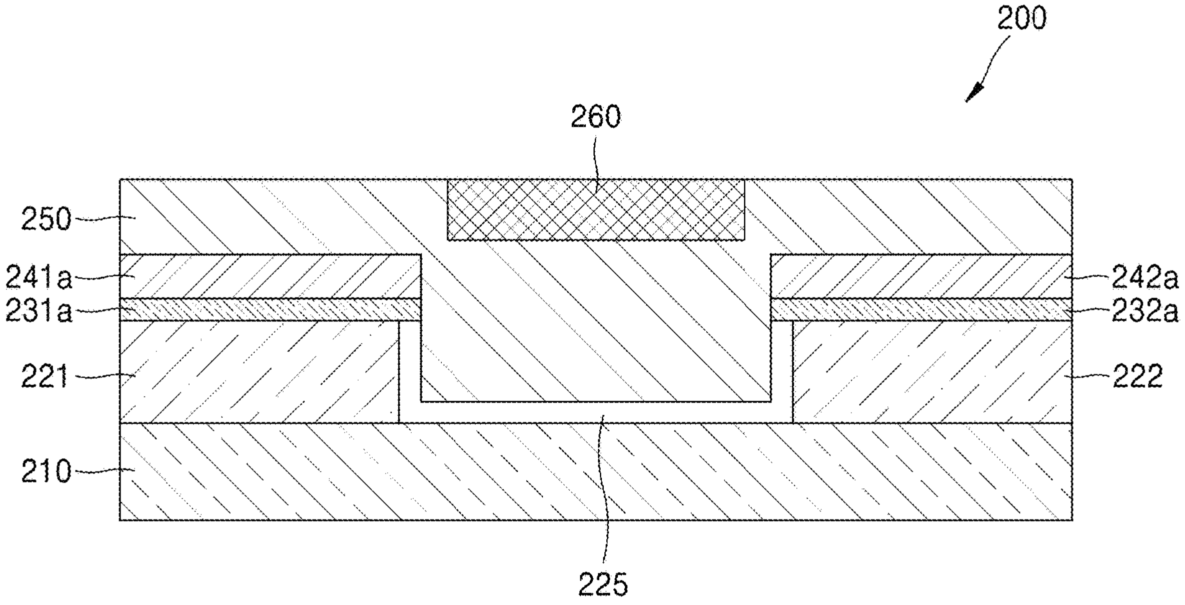
FIG. 16A illustrates an example in which a field effect transistor has a top gate structure according to an example embodiment.

FIG. 16A illustrates an example in which a field effect transistor 200 according to an example embodiment is applied to a top gate structure.

The field effect transistor 200 includes a substrate 210, a source electrode 221 provided on the substrate 210, a drain electrode 222 provided apart from the source electrode 221 on the substrate 210, and a channel 225 provided between the source electrode 221 and the drain electrode 222. A first 2D material electrode bonding layer 231*a* may be provided on the source electrode 221, and a second 2D material electrode bonding layer 232*a* may be provided on the drain electrode 222. The first 2D material electrode bonding layer 231*a* and the second 2D material electrode bonding layer 232*a* may include a tensile strain region. A first stressor 241*a* may be provided on the first 2D material electrode bonding layer 231*a*, and a second stressor 242*a* may be provided on the second 2D material electrode bonding layer 232*a*. The first stressor 241*a* and the second stressor 242*a* may include a material represented by (M1)a(M2)b, wherein M1 may include any one of Mo, W, Hf, Nb, and Si, M2 may include O, S, Se, Te, and N, and $0<a\leq3$ and $0<b\leq3$. The first stressor 241*a* and the second stressor 242*a* may have an oxidation reaction, nitridation reaction, or chalcogenide reaction structure.

An insulating layer 250 may be provided to cover the first stressor 241*a*, the second stressor 242*a*, and the channel 225, and a gate electrode 260 may be provided on the insulating layer 250. The gate electrode 260 may be provided inside the insulating layer 250 or on the insulating layer 250. In the present embodiment, the field effect transistor 200 may be applied in substantially the same manner as the field effect transistor having a bottom gate structure described with reference to FIGS. 1 to 12, except for having a top gate structure.

Figure 16B:
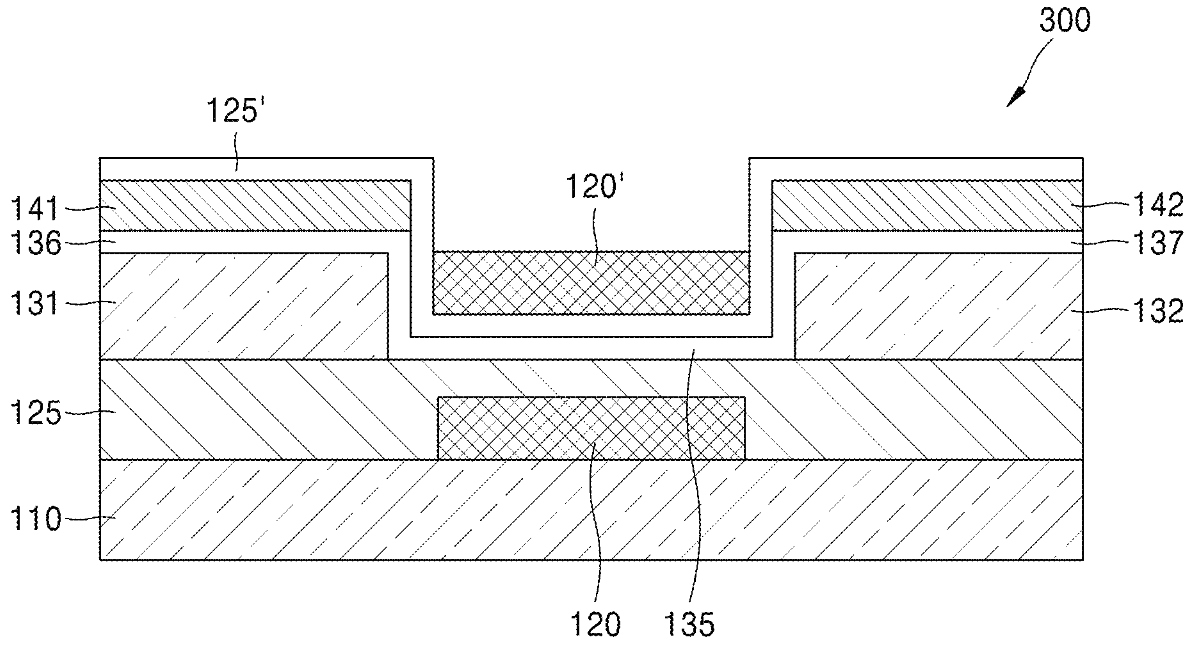
FIG. 16B illustrates an example in which a field effect transistor has a double-gate structure according to an example embodiment.

Additionally, in an example embodiment, a field effect transistor may have a double-gate structure. FIG. 16B illustrates an example in which a field effect transistor has a double-gate structure according to an example embodiment.

Referring to FIG. 16B, a field effect transistor 300 may have the same structure as the field effect transistor 100 described in FIG. 1, except the field effect transistor 300 may further include an insulating layer 125' covering the first stressor 141, channel 135, and second stressor 142, and a gate electrode 120' on the insulating layer 125' over the channel 135. The materials for the insulating layer 125 and 125' are not particularly limited and may be formed of any one of various materials suitable for gate insulating layers in transistors, such as silicon oxide, a high-k dielectric (e.g., aluminum oxide, hafnium oxide), and the like. The field effect transistor 300 may have a double-gate structure, in a which a bottom gate 120 and a top-gate 120' are provided.

While FIG. 16B is an example in which the transistor 100 in FIG. 1 further includes the insulating layer 125' and gate electrode 120', the transistors 100 described in FIGS. 2 to 12 also may be modified to have a double-gate structure by forming an insulating layer 125' over the bottom-gate transistor and forming a gate electrode 120' on the insulating layer 125' over the channel 135.

The field effect transistor according to an example embodiment has a highly miniaturized size and exhibits excellent electrical performance, and thus is suitable for an integrated circuit (IC) device having a high degree of integration. The field effect transistor according to an example embodiment may constitute a transistor constituting a digital circuit or an analog circuit. In some embodiments, the field effect transistor may be used as a high-voltage transistor or a low-voltage transistor. For example, the field effect transistor according to an example embodiment may constitute a high-voltage transistor constituting a peripheral circuit of a flash memory device, which is a non-volatile memory device operating at a high voltage, or an electrically erasable and programmable read only memory (ROM) (EEPROM) device. Alternatively, the field effect transistor according to an example embodiment may constitute a transistor included in an IC device for a liquid crystal display (LCD) requiring an operating voltage of 10 V or more, for example, an operating voltage of about 20 V to about 30 V, or an IC chip used in a plasma display panel (PDP) requiring an operating voltage of about 100 V.

Figure 16C:
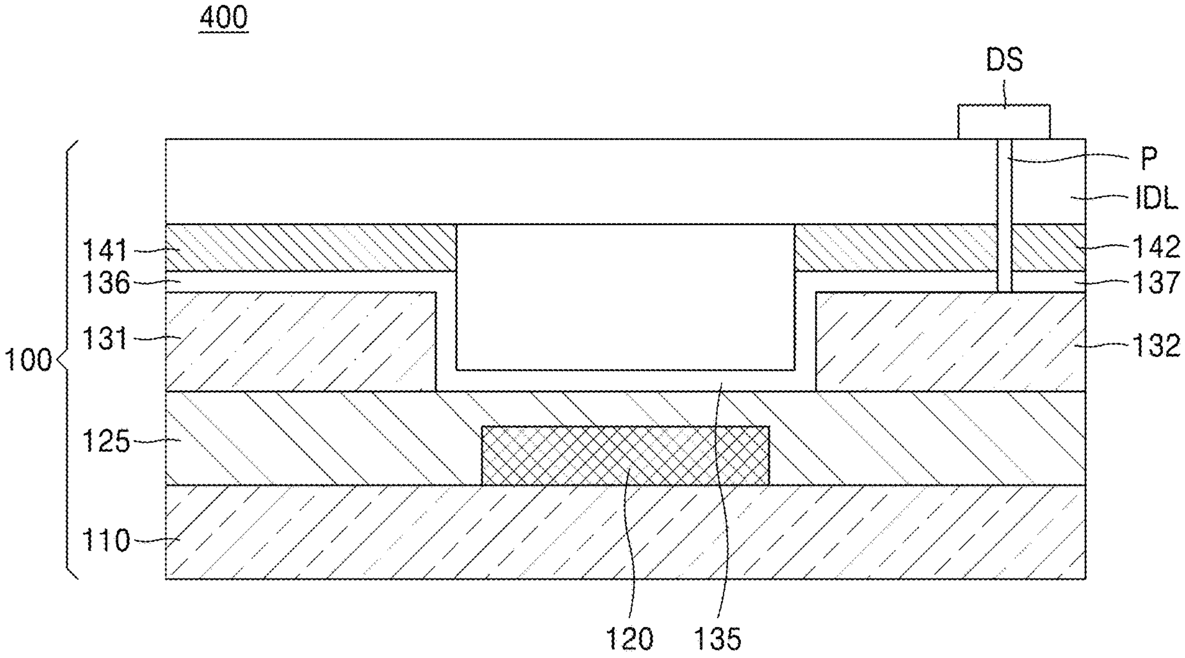
FIG. 16C illustrates an example of a memory structure including a field effect transistor according to an example embodiment.

FIG. 16C illustrates an example of a memory structure including a field effect transistor according to an example embodiment.

Referring to FIG. 16C, the memory structure 400 may be the same as the transistor 100 in FIG. 1, except the memory structure 400 may further include a data storage element DS connected to the drain electrode 132 through a plug P to provide a memory structure. The plug P may include a conductive material such as a metal or metal alloy and may penetrate through an interlayer dielectric ILD to electrically contact the drain electrode 132. The plug P may also penetrate through layers between the drain electrode 132 and the data storage element DS. For example, as shown in FIG. 16C. the plug P penetrates through the second stressor 142 and the second 2D material electrode bonding layer 137. The data storage element DS may be capable of storing data corresponding to '1' or '0.' The data storage element DS may be a capacitor or a magnetic tunnel junction, but is not limited thereto.

While FIG. 16C illustrates an example of a memory structure 400 in which the transistor 100 in FIG. 1 further includes interlayer dielectric ILD, plug P, and data storage DS to provide the memory structure 400, the transistors 100 described in FIGS. 2 to 12 and transistors 200 and 300 in FIGS. 16A and 16B also may be modified similarly to provide a memory structure including the interlayer dielectric ILD, plug P, and data storage DS.

Figure 17:
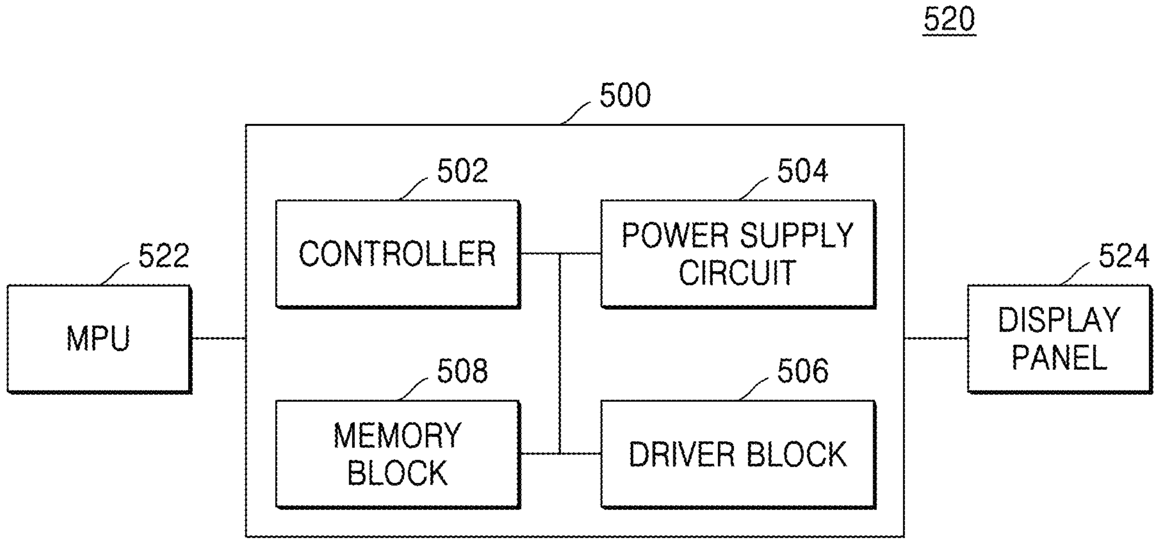
FIG. 17 is a schematic block diagram of a display driver integrated circuit (IC) (DDI) including a field effect transistor according to an example embodiment, and a display device including the DDI.

FIG. 17 is a schematic block diagram of a display driver IC (DDI) 500 according to an example embodiment, and a display device 520 including the DDI 500.

Referring to FIG. 17, the DDI 500 may include a controller 502, a power supply circuit 504, a driver block 506, and a memory block 508. The controller 502 receives and decodes a command applied from a main processing unit (MPU) 522, and controls each block of the DDI 500 to implement an operation according to the command. The power supply circuit 504 generates a driving voltage in response to the control by the controller 502. The driver block 506 drives a display panel 524 by using the driving voltage generated by the power supply circuit 504 in response to the control by the controller 502. The display panel 524 may be a liquid crystal display panel or a plasma display panel. The memory block 508 may be a block for temporarily storing commands input to the controller 502 or control signals output from the controller 502, or for storing necessary data, and may include memory such as random access memory (RAM) or ROM. The power supply circuit 504 and the driver block 506 may include the field effect transistor according to an example embodiment described above with reference to FIGS. 1 to 15.

Figure 18:
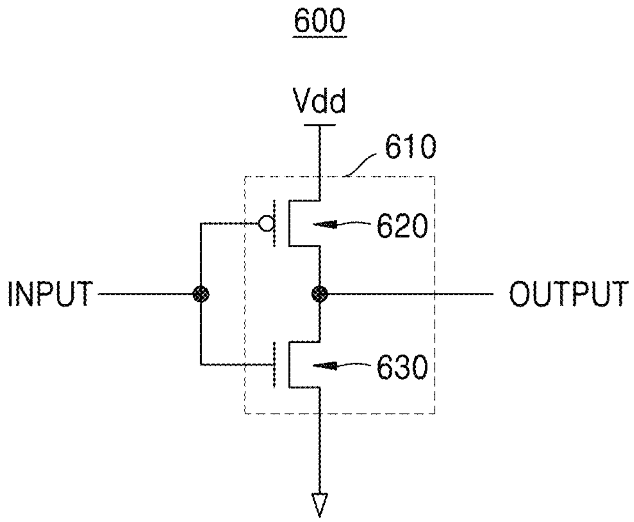
FIG. 18 is a circuit diagram of a complementary metal-oxide semiconductor (CMOS) inverter including a field effect transistor according to an example embodiment.

FIG. 18 is a circuit diagram of a complementary metal-oxide semiconductor (MOS) (CMOS) inverter 600 according to an example embodiment.

The CMOS inverter 600 includes a CMOS transistor 610. The CMOS transistor 610 includes a p-channel MOS (PMOS) transistor 620 and an n-channel MOS (NMOS) transistor 630 connected between a power terminal Vdd and a ground terminal. The CMOS transistor 610 may include the field effect transistor according to an example embodiment described above with reference to FIGS. 1 to 16.

Figure 19:
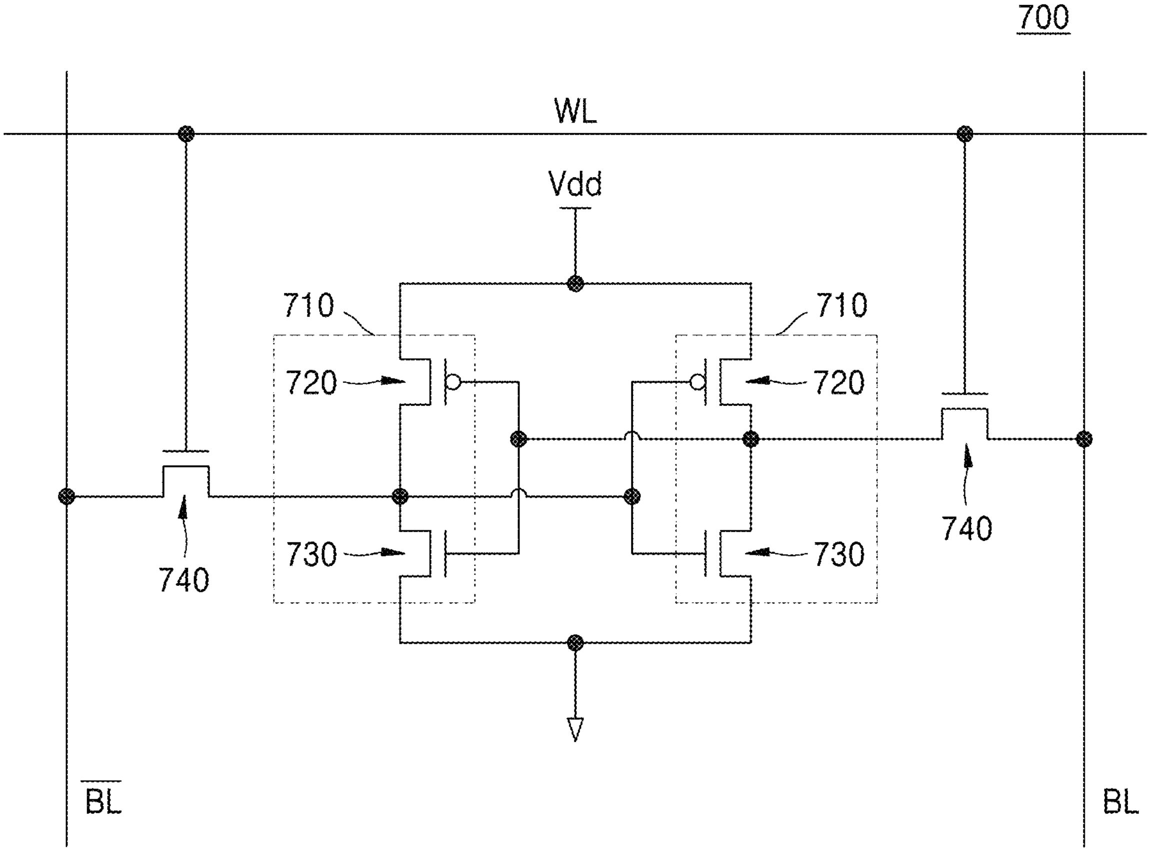
FIG. 19 is a circuit diagram of a CMOS static random-access memory (SRAM) device including a field effect transistor according to an example embodiment.

FIG. 19 is a circuit diagram of a CMOS static RAM (SRAM) device 700 according to an example embodiment.

The CMOS SRAM device 700 includes a pair of driving transistors 710. Each of the pair of driving transistors 710 includes a PMOS transistor 720 and an NMOS transistor 730 connected between a power terminal Vdd and a ground terminal. The CMOS SRAM device 700 may further include a pair of transfer transistors 740. A source of the transfer transistor 740 is cross-connected to a common node of the PMOS transistor 720 and the NMOS transistor 730 constituting the driving transistor 710. The power terminal Vdd is connected to the source of the PMOS transistor 720, and the ground terminal is connected to the source of the NMOS transistor 730. A word line WL may be connected to gates of the pair of transfer transistors 740, and a bit line BL and an inverted bit line may be respectively connected to drains of the pair of transfer transistors 740.

At least one of the driving transistor 710 and the transfer transistor 740 of the CMOS SRAM device 700 may include the field effect transistor according to an example embodiment described above with reference to FIGS. 1 to 16.

Figure 20:
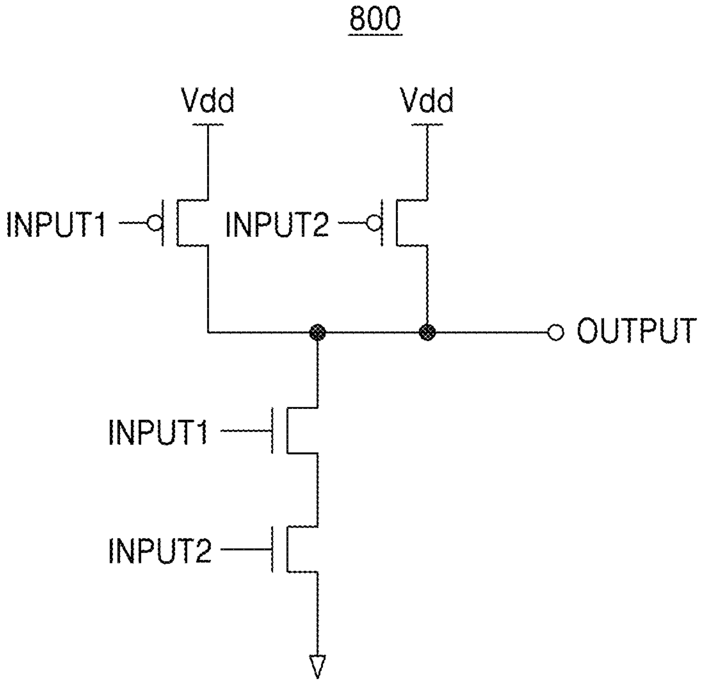
FIG. 20 is a circuit diagram of a CMOS NAND circuit including a field effect transistor according to an example embodiment.

FIG. 20 is a circuit diagram of a CMOS NAND circuit 800 according to an example embodiment.

The CMOS NAND circuit 800 includes a pair of CMOS transistors to which different input signals are transmitted. The CMOS NAND circuit 800 may include the field effect transistor according to an example embodiment described above with reference to FIGS. 1 to 16.

Figure 21:
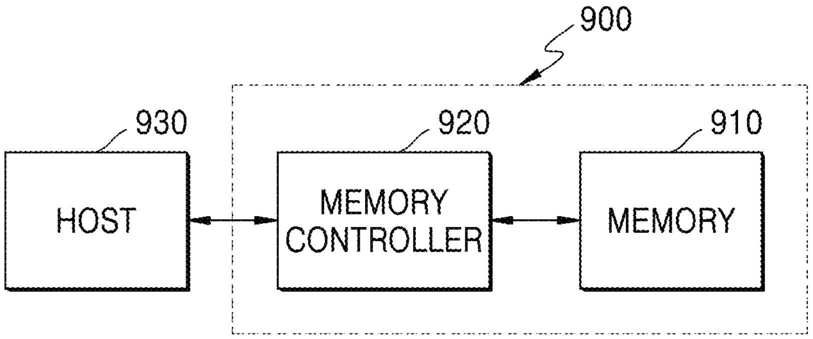
FIG. 21 is a block diagram of an electronic apparatus including a field effect transistor according to an example embodiment.

FIG. 21 is a block diagram of an electronic apparatus 900 according to an example embodiment.

The electronic apparatus 900 includes a memory 910 and a memory controller 920. The memory controller 920 may control the memory 910 to read data from the memory 910 and/or to write data to the memory 910 in response to a request of a host 930. At least one of the memory 910 and the memory controller 920 may include the field effect transistor according to an example embodiment described above with reference to FIGS. 1 to 16.

Figure 22:
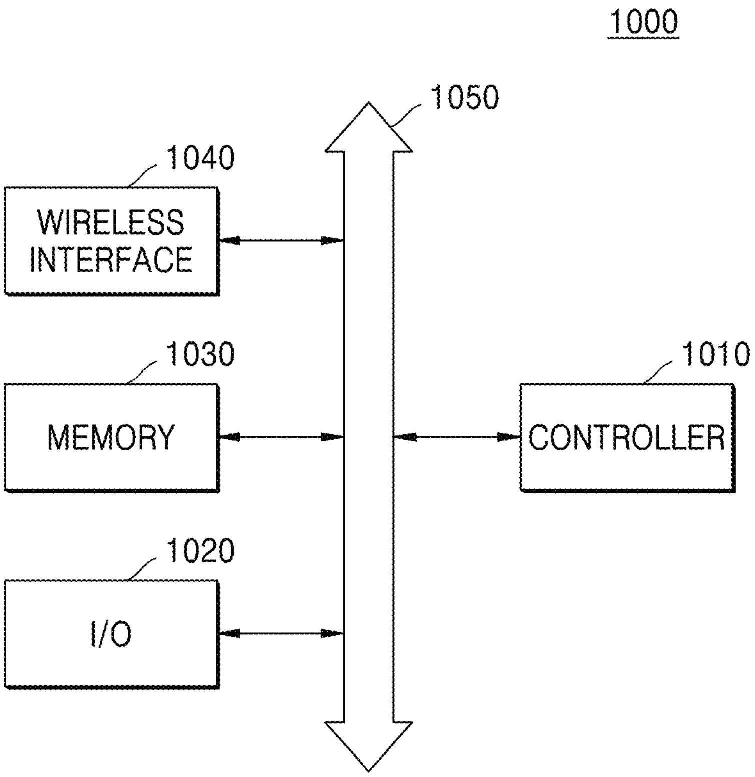
FIG. 22 is a block diagram of an electronic apparatus including a field effect transistor according to an example embodiment.

FIG. 22 is a block diagram of an electronic apparatus 1000 according to an example embodiment.

The electronic apparatus 1000 may constitute a wireless communication device, or a device capable of transmitting and/or receiving information in a wireless environment. The electronic apparatus 1000 includes a controller 1010, an input/output (I/O) device 1020, a memory 1030, and a wireless interface 1040, which are interconnected through a bus 1050.

The controller 1010 may include at least one of a microprocessor, a digital signal processor, or a processing device similar thereto. The I/O device 1020 may include at least one of a keypad, a keyboard, or a display. The memory 1030 may be used to store commands executed by the controller 1010. For example, the memory 1030 may be used to store user data. The electronic apparatus 1000 may use the wireless interface 1040 to transmit/receive data through a wireless communication network. The wireless interface 1040 may include an antenna and/or a wireless transceiver. In some embodiments, the electronic apparatus 1000 may be used for a third generation communication system, for example, code division multiple access (CDMA), global system for mobile communications (GSM), north American digital cellular (NADC), extended-time division multiple access (E-TDMA), and/or a communication interface protocol for the third generation communication system, for example, wide band code division multiple access (WCDMA). The electronic apparatus 1000 may include the field effect transistor according to an example embodiment described above with reference to FIGS. 1 to 16.

The field effect transistor according to an example embodiment may exhibit good electrical performance with a highly miniaturized structure, and thus may be applied to an IC device, and may realize miniaturization, low power, and high performance.

In the field effect transistor according to an example embodiment, the conductivity of a 2D material electrode bonding layer may be increased by applying a tensile strain to the 2D material electrode bonding layer via a stressor. The electronic apparatus according to an example embodiment may be miniaturized and improved in electrical performance by including the field effect transistor. In the method of manufacturing a field effect transistor according to an example embodiment, a tensile strain may be applied to a 2D material electrode bonding layer by oxidizing a stressor to increase a volume thereof.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU) , an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A field effect transistor comprising:
- a substrate;
- a gate electrode on the substrate;
- an insulating layer on the gate electrode;
- a source electrode on the insulating layer;
- a drain electrode spaced apart from the source electrode;
- a channel between the source electrode and the drain electrode and comprising a two-dimensional (2D) material;
- a 2D material electrode bonding layer adjacent to the source electrode and the drain electrode and comprising a tensile strain region; and
- a stressor configured to apply a tensile strain to the 2D material electrode bonding layer,
- wherein the channel is configured to have no tensile strain region.

2. The field effect transistor of claim 1, wherein the 2D material electrode bonding layer comprises graphene, black phosphorus, phosphorene, or transition metal dichalcogenide.

3. The field effect transistor of claim 2, wherein
- the 2D material electrode bonding layer comprises the transition metal dichalcogenide,
- the transition metal dichalcogenide comprises a transition metal and a chalcogen element,
- the transition metal includes one of Mo, W, Nb, V, Ta, Ti, Zr, Hf, Tc, Re, Cu, Ga, In, Sn, Ge, and Pb, and
- the chalcogen element includes one of S, Se, and Te.

4. The field effect transistor of claim 2, wherein the transition metal dichalcogenide comprises one of $MoS_2$, $WS_2$, $MoSe_2$, and $WSe_2$.

5. The field effect transistor of claim 1, wherein the 2D material electrode bonding layer is integrally provided with the channel.

6. The field effect transistor of claim 1, wherein the stressor is positioned above the 2D material electrode bonding layer, below the 2D material electrode bonding layer, or below the source electrode and the drain electrode.

7. The field effect transistor of claim 1, wherein
- the stressor comprises a material represented by $(M1)_a(M2)_b$,
- wherein M1 comprises any one of Mo, W, Hf, Nb, and Si,
- M2 comprises any one of O, S, Se, Te, and N,
- $0<a\leq 3$, and
- $0<b\leq 3$.

8. The field effect transistor of claim 7, wherein the stressor comprises MoO, $MoO_2$, $MoO_3$, $PtS_2$, $SiO_2$, or SiN.

9. The field effect transistor of claim 1, wherein the 2D material electrode bonding layer comprises a strain region in a region facing the stressor.

10. The field effect transistor of claim 1, further comprising:
- an interlayer between the 2D material electrode bonding layer and the stressor, wherein
- the interlayer comprises TiOx ($0<x\leq 3$) or CrOx ($0<x\leq 3$).

11. The field effect transistor of claim 1, wherein the stressor is configured to operate as an electrode.

12. The field effect transistor of claim 1, wherein the tensile strain region is in the 2D material electrode bonding layer.

13. An electronic apparatus comprising:
- a memory comprising a field effect transistor; and
- a memory controller configured to control the memory,
- wherein the field effect transistor comprises
  - a substrate,
  - a gate electrode on the substrate,
    - an insulating layer on the gate electrode,
    - a source electrode on the insulating layer,
    - a drain electrode spaced apart from the source electrode,
    - a channel between the source electrode and the drain electrode and comprising a two-dimensional (2D) material,
    - a 2D material electrode bonding layer adjacent to the source electrode and the drain electrode and comprising a tensile strain region, and
    - a stressor configured to apply a tensile strain to the 2D material electrode bonding layer,
    - wherein the channel is configured to have no tensile strain region.

14. The electronic apparatus of claim 13, wherein the 2D material electrode bonding layer comprises graphene, black phosphorus, phosphorene, or transition metal dichalcogenide.

15. The electronic apparatus of claim 14, wherein the transition metal dichalcogenide comprises one of $MoS_2$, $WS_2$, $MoSe_2$, and $WSe_2$.

16. The electronic apparatus of claim 13, wherein the 2D material electrode bonding layer is integrally provided with the channel.

17. The electronic apparatus of claim 13, wherein the stressor is positioned above the 2D material electrode bonding layer, below the 2D material electrode bonding layer, or below the source electrode and the drain electrode.

18. The electronic apparatus of claim 13, wherein the stressor comprises a material represented by $(M1)_a(M2)_b$, wherein M1 comprises any one of Mo, W, Hf, Nb, and Si, M2 comprises any one of O, S, Se, Te, and N, $0<a\leq 3$, and $0<b\leq 3$.

19. The electronic apparatus of claim 13, wherein the stressor comprises MoO, $MoO_2$, $MoO_3$, $PtS_2$, $SiO_2$, or SiN.

20. A method of manufacturing a field effect transistor, the method comprising:

forming a gate electrode on a substrate;

forming an insulating layer on the gate electrode;

forming a source electrode and a drain electrode on the insulating layer, the drain electrode being spaced apart from the source electrode;

forming a channel between the source electrode and the drain electrode, the channel comprising a two-dimensional (2D) material;

forming a 2D material electrode bonding layer adjacent to the source electrode and the drain electrode; and forming a stressor adjacent to the 2D material electrode bonding layer, the stressor being configured to apply a tensile strain to the 2D material electrode bonding layer such that the 2D material electrode bonding layer comprises a tensile strain region, wherein the channel is configured to have no tensile strain region.

21. The method of claim 20, wherein the 2D material electrode bonding layer comprises graphene, black phosphorus, phosphorene, or transition metal dichalcogenide.

22. The method of claim 21, wherein the 2D material electrode bonding layer comprises the transition metal dichalcogenide, and the transition metal dichalcogenide comprises one of $MoS_2$, $WS_2$, $MoSe_2$, and $WSe_2$.

23. The method of claim 20, wherein the stressor is positioned above the 2D material electrode bonding layer, below the 2D material electrode bonding layer, or below the source electrode and the drain electrode.

24. The method of claim 20, wherein the stressor comprises a material represented by $(M1)_a(M2)_b$, wherein M1 comprises any one of Mo, W, Hf, Nb, and Si, M2 comprises any one of O, S, Se, Te, and N, $0<a\leq 3$, and $0<b\leq 3$.

25. The method of claim 20, wherein the stressor comprises MoO, $MoO_2$, $MoO_3$, $PtS_2$, $SiO_2$, or SiN.

26. A field effect transistor comprising:

a substrate;

a plurality of electrodes including a source electrode, a drain electrode, and a gate electrode spaced apart from each other on the substrate;

a channel on the substrate between the source electrode and the drain electrode, the channel comprising a two-dimensional (2D) material;

an insulating layer extending between the channel and the gate electrode;

a first 2D material electrode bonding layer connected to a first end of the channel, the first 2D material electrode bonding layer being spaced apart from the gate electrode and the drain electrode; and a first stressor on at least one of the insulating layer and the source electrode, the first stressor adjacent to the first 2D material electrode bonding layer and configured to apply a tensile strain to the first 2D material electrode bonding layer, wherein the channel is configured to have no tensile strain region.

27. The field effect transistor of claim 26, wherein the first 2D material electrode bonding layer comprises graphene, black phosphorus, phosphorene, or transition metal dichalcogenide.

28. The field effect transistor of claim 26, wherein the first stressor comprises a material represented by $(M1)_a(M2)_b$, wherein M1 comprises any one of Mo, W, Hf, Nb, and Si, M2 comprises any one of O, S, Se, Te, and N, $0<a\leq 3$, and $0<b\leq 3$.

29. The field effect transistor of claim 26, wherein the first 2D material electrode bonding layer is integrally provided with the channel.

30. The field effect transistor of claim 26, further comprising:

a second 2D material electrode bonding layer connected to a second end of the channel, the second 2D material electrode bonding layer being spaced apart from the gate electrode and the source electrode; and a second stressor on at least one of the insulating layer and the drain electrode, the second stressor adjacent to the second 2D material electrode bonding layer and configured to apply a tensile strain to the second 2D material electrode bonding layer.

* * * * *